United States Patent
Ho et al.

(10) Patent No.: US 9,460,779 B2
(45) Date of Patent: Oct. 4, 2016

(54) MEMORY SENSING METHOD USING ONE-TIME SENSING TABLE AND ASSOCIATED MEMORY DEVICE

(71) Applicant: Macronix International Co., Ltd., Hsinchu (TW)

(72) Inventors: Kin-Chu Ho, Macau (CN); Hsiang-Pang Li, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 23 days.

(21) Appl. No.: 14/277,087

(22) Filed: May 14, 2014

(65) Prior Publication Data

US 2015/0332737 A1   Nov. 19, 2015

(51) Int. Cl.
| | |
|---|---|
| *G11C 11/56* | (2006.01) |
| *G11C 7/00* | (2006.01) |
| *G11C 11/16* | (2006.01) |
| *G11C 13/00* | (2006.01) |

(52) U.S. Cl.
CPC ............ *G11C 11/56* (2013.01); *G11C 7/00* (2013.01); *G11C 11/1673* (2013.01); *G11C 11/5642* (2013.01); *G11C 13/004* (2013.01); *G11C 2013/0057* (2013.01)

(58) Field of Classification Search
CPC .............. G11C 11/56; G11C 11/1673; G11C 11/5642; G11C 7/00; G11C 13/004; G11C 13/0057

USPC ................ 365/189.011, 185.17, 196, 205
See application file for complete search history.

(56) References Cited

U.S. PATENT DOCUMENTS

| | | | | |
|---|---|---|---|---|
| 8,780,635 | B2* | 7/2014 | Li | G11C 16/08 365/185.17 |
| 8,988,946 | B1* | 3/2015 | D'Abreu | G11C 16/28 365/185.08 |
| 9,244,763 | B1* | 1/2016 | Kankani | G06F 11/1008 |
| 2008/0106936 | A1* | 5/2008 | Yang | G11C 11/5628 365/185.03 |
| 2008/0170439 | A1* | 7/2008 | Sutardja | G11C 11/5671 365/185.17 |
| 2011/0066902 | A1* | 3/2011 | Sharon | G11C 16/349 714/721 |
| 2013/0241848 | A1* | 9/2013 | Takahashi | G06F 3/041 345/173 |
| 2013/0272368 | A1* | 10/2013 | Yang | H04B 14/026 375/238 |
| 2014/0281800 | A1* | 9/2014 | Micheloni | G06F 11/1012 714/759 |
| 2014/0293696 | A1* | 10/2014 | Lin | G11C 16/26 365/185.12 |

* cited by examiner

Primary Examiner — Alexander Sofocleous
Assistant Examiner — Sung Cho
(74) Attorney, Agent, or Firm — McClure, Qualey & Rodack, LLP

(57) ABSTRACT

A memory sensing method is provided. The memory sensing method comprises the following steps: sensing a first memory unit to obtain a first sensing result; sensing a second memory unit to obtain a second sensing result; and looking up a one-time sensing table according to the first and second sensing results to obtain an output data.

14 Claims, 5 Drawing Sheets

500

|  | L1' | L2' | L3' | L4' |
|---|---|---|---|---|
| L1 | X | X | 010 | 011 |
| L2 | X | X | 000 | 001 |
| L3 | 110 | 100 | X | X |
| L4 | 111 | 101 | X | X |

| first sensing result | second sensing result | output data |
|---|---|---|
| Vt < b | Vt' > b | 0 |
| Vt > b | Vt' < b | 1 |

|    | L1' | L2' | L3' | L4' |
|----|-----|-----|-----|-----|
| L1 | X   | X   | 010 | 011 |
| L2 | X   | X   | 000 | 001 |
| L3 | 110 | 100 | X   | X   |
| L4 | 111 | 101 | X   | X   |

FIG. 7A

| first sensing result | second sensing result | output data |
|---|---|---|
| Vt < a | Vt' > a | 1 |
| Vt > a | Vt' < a | 1 |
| Vt > a | Vt' > a | 0 |

FIG. 7B

|     | L1' | L2' | L3' | L4' |
|-----|-----|-----|-----|-----|
| L1  | X   | X   | 010 | 011 |
| L2  | X   | X   | 000 | 001 |
| L3  | 110 | 100 | X   | X   |
| L4  | 111 | 101 | X   | X   |

FIG. 8A

| first sensing result | second sensing result | output data |
|---|---|---|
| $Vt < c$ | $Vt' > c$ | 1 |
| $Vt > c$ | $Vt' < c$ | 1 |
| $Vt < c$ | $Vt' < c$ | 0 |

FIG. 8B

MEMORY SENSING METHOD USING ONE-TIME SENSING TABLE AND ASSOCIATED MEMORY DEVICE

TECHNICAL FIELD

The disclosure relates in general to a memory sensing method and an associated memory device, and more particularly to a memory sensing method using a one-time sensing table and an associated memory device.

BACKGROUND

Multi-Level Cell (MLC) technology enables storage of multiple bits per memory cell by charging the floating gate of a transistor to different levels. For example, by dividing the voltage across each cell into four threshold voltage regions, each MLC memory cell is capable of storing two bits per memory cell. Therefore, MLC effectively reduces cell area as well as the die size for a given density.

However, during data read, it needs to perform more than one sensing operations to read data stored in a MLC memory cell. For example, given that the four threshold voltage regions of a MLC memory cell from low to high are corresponding to data "11", "10", "00" and "01", respectively, it needs to perform twice data sensing operations to obtain the least significant bit stored in the MLC memory cell.

Therefore, there is a need for a memory sensing technology capable of effectively reducing the number of sensing operations when reading data from the memory.

SUMMARY

The disclosure is directed to a memory sensing method using a one-time sensing table and an associated memory device. One of the advantages of the method and device is that they significantly reduce the number of sensing operations when reading data from a memory. In an embodiment, more than one memory units are regarded as a storage unit for storing data. By performing one sensing operation for each of the memory units in the storage unit, and looking up the one-time sensing table according to the sensing results, the bit of data can then be obtained.

According to an aspect the present invention, a memory sensing method is provided. The memory sensing method comprises the following steps: sensing a first memory unit to obtain a first sensing result; sensing a second memory unit to obtain a second sensing result; and looking up a one-time sensing table according to the first and second sensing results to obtain an output data.

According to another aspect the present invention, a memory device is provided. The memory device comprises a first memory unit, a second memory unit, a sensing circuit and a processing unit. The sensing circuit is adapted to sense the first and second memory units to obtain a first sensing result and a second sensing result, respectively. The processing unit is adapted to look up a one-time sensing table according to the first and second sensing results to obtain an output data.

The above and other aspects of the invention will become better understood with regard to the following detailed description of the embodiments. The following description is made with reference to the accompanying drawings.

BRIEF DESCRIPTION OF THE DRAWINGS

FIG. 7A illustrates using the sensing voltage "a" to sense the second bit of 3-bit data based on the one-time sensing table.

FIG. 7B illustrates the relationship between the output data and the sensing results.

FIG. 8A illustrates using the sensing voltage "c" to sense the third bit of 3-bit data based on the one-time sensing table.

FIG. 8B illustrates the relationship between the output data and the sensing results.

Figure 1:
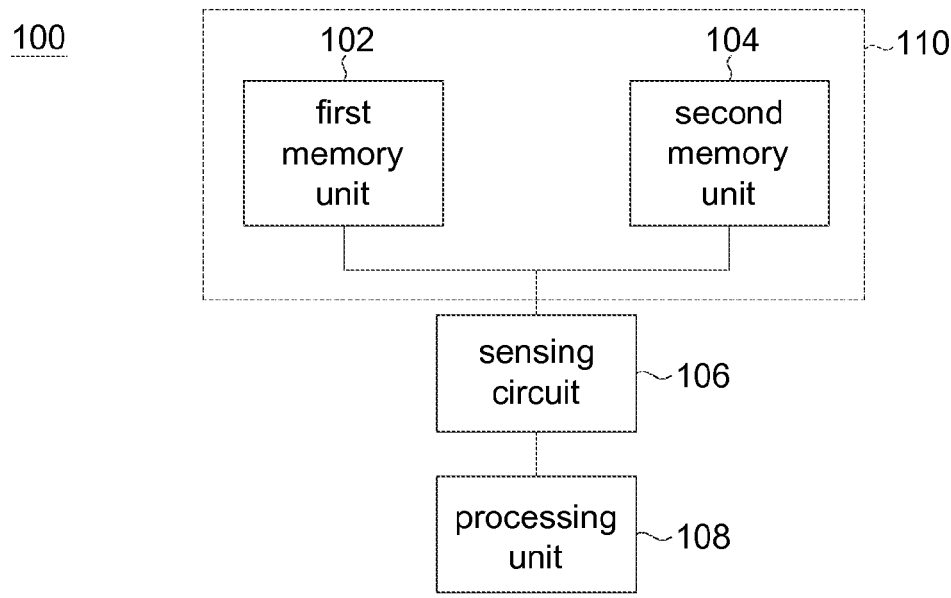
FIG. 1 illustrates a simplified block diagram of a memory device according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A number of preferred embodiments are disclosed below for elaborating the details of the invention. However, the invention is not limited to the embodiments, and the embodiments are for elaborating the invention not for limiting the scope of protection of the invention. Moreover, secondary elements are omitted in the embodiments to highlight the characteristics of the invention.

FIG. 1 illustrates a simplified block diagram of a memory device 100 according to an embodiment of the present invention. The memory device 100 comprises a first memory unit 102, a second memory unit 104, a sensing circuit 106 and a processing unit 108. The first and second memory units 102, 104 may be memory cells of NAND flash, NOR flash, Dynamic Random-Access Memories (DRAMs), Resistive Random-Access Memories (ReRAMs), Phase-Change Random Access Memories (PCRAMs), Magnetoresistive Random-Access Memories (MRAMs) or Static Random Access Memories (SRAM) or the combination thereof. In an example, the first and second memory units 102, 104 can be realized as the same kind of memory cells, while in another example, the first and second memory units 102, 104 can be realized as different kinds of memory cells.

The sensing circuit 106 is adapted to perform sensing operations on the first and second memory units 102, 104. The sensing circuit 106 can be realized by, for example, a sensing amplifier. Each of the first and second memory units 102, 104 can be sensed by the sensing circuit 106 in a way corresponding to its cell type. For example, given that the first and second memory units 102, 104 are memory cells of a NAND flash, the sensing circuit 106 is capable of sensing the first and second memory units 102, 104 by applying voltages to word lines coupled to the first and second memory units 102, 104. In other examples, the sensing circuit 106 is capable of sensing the first and second memory units 102, 104 by detecting cell currents or magnetic fields depends on the cell types of the first and second memory units 102, 104.

In the embodiment, the first and second memory units 102, 104 as a whole are regarded as a storing unit 110 for storing data. The processing unit 108 is adapted to read the data stored in the storing unit 110. The processing unit 108 can be realized by, for example, an integrated circuit capable of interpreting the sensing results to be logic data according to a one-time sensing table. The one-time sensing table can be stored in the processing unit 108 or other data storage spaces in the memory device 100.

Figure 2:
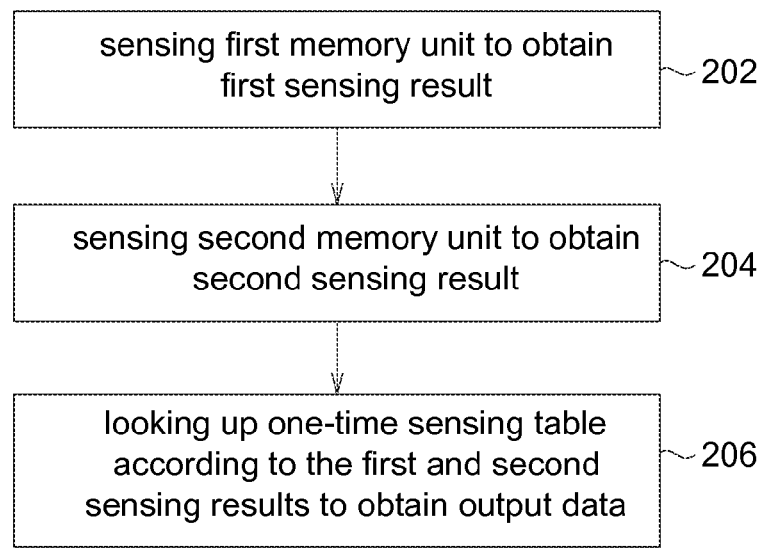
FIG. 2 illustrates a flow chart of a memory sensing method for the memory device.

FIG. 2 illustrates a flow chart of a memory sensing method for the memory device 100. At step 202, the sensing circuit 106 senses the first memory unit 102 to obtain a first sensing result. At step 204, the sensing circuit 106 senses the second memory unit 104 to obtain a second sensing result. The steps 202 and 204 can be performed simultaneously or in a different order. For example, the first and second memory cells 102, 104 as a whole can be sensed by the sensing circuit 106 at the same time to obtain the first and second sensing results. Or, the first and second memory cells 102, 104 can be sensed by the sensing circuit 106 at different time points.

At step 206, the processing unit 108 looks up a one-time sensing table according to the first and second sensing results to obtain an output data. For example, given that the sensing voltage applied by the sensing circuit 106 is larger than the threshold voltage of the first memory unit 102 and is smaller than the threshold voltage of the second memory unit 104, the processing unit 108 maps these sensing results to an output data "0" by looking up the one-time sensing table.

As shown in the above, the memory device 100 is able to read one or more bits of data stored in the storing unit 110 by sensing each of the memory units 102, 104 in the storing unit 110 only one time. Therefore, the number of sensing operations for reading memory data can be significantly reduced, and the accessing procedure of memory gains speed up.

It can be understood that the invention is not limited to the above example. The storing unit 110 may include more than two memory units. In such case, by sensing each of the memory units comprised in the storing unit 110 one time and looking up a one-time sensing table according to the sensing results, the processing unit 108 is able to obtain the bit data stored in the storing unit 110.

For better illustrations, the following taking the first and second memory units 102, 104 shown in FIG. 1 being MLC memory cells for example.

Figure 3:
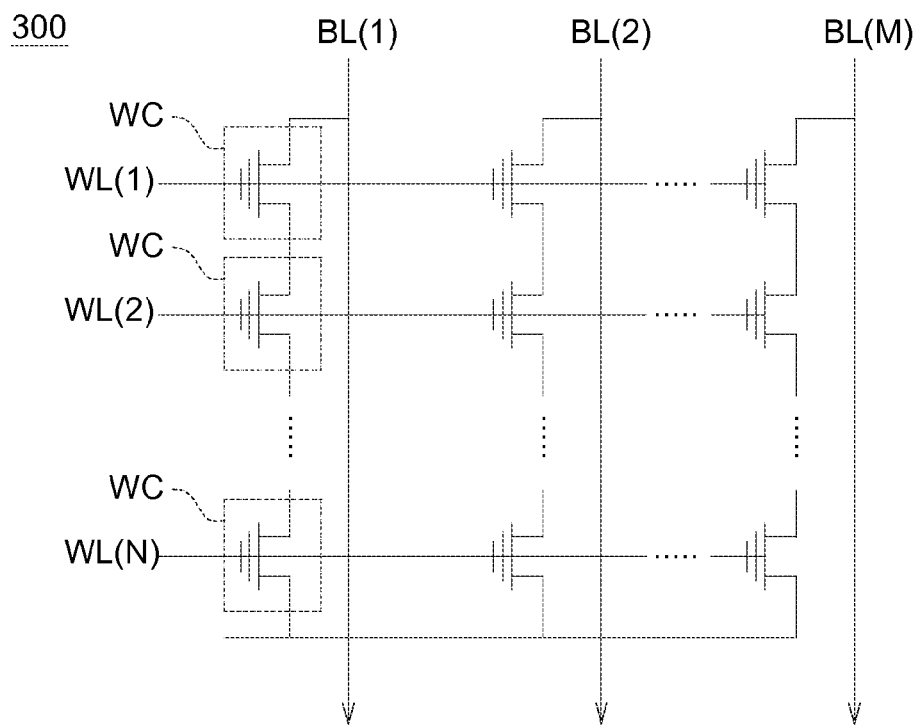
FIG. 3 illustrates a circuit diagram of a MLC flash array 300.

FIG. 3 illustrates a circuit diagram of a MLC flash array 300. As shown in FIG. 3, memory cells MC are arranged in rows and columns. The memory cells in each row are coupled to a word line (e.g., WL(1)), and the memory cells MC in each column are coupled to a bit line (e.g., BL(1)). The word lines WL(1)-WL(N) and bit lines BL(1)-BL(M) are used for read and write operations of the MLC flash array 300. During a read operation, a word line (e.g., WL(1)) is asserted, and the threshold voltage of each memory cell MC coupled to the word line WL(1) can be obtained from the bit lines BL(1)-BL(M).

The first and second memory units 102, 104 shown in FIG. 1, which comprised in the storing unit 110, can be any two of the memory cells MC of the MLC flash array 300. In this example, the first memory unit 102 is programmed to a first threshold voltage and is coupled to a first word line (e.g., WL(1)). By applying a first voltage to the first word line (e.g., WL(1)), the sensing circuit 106 is able to determine the first sensing result according to the relative magnitude of the first sensing voltage and the first threshold voltage. Similar to the first memory unit 102, the second memory unit 104 is programmed to a second threshold voltage and is coupled to a second word line (e.g., WL(2)). In an example, the second word line may be the same as the first word line. That is, the first and second memory units 102, 104 may be coupled to the same word line. By applying a second voltage to the second word line (e.g., WL(2)), the sensing circuit 106 is able to determine the second sensing result according to the relative magnitude of the second sensing voltage and the second threshold voltage region.

It can be understood that the invention is not limited to the above example. More than two memory cells MC as a whole can be regarded as a storing unit. In such case, the sensing circuit 106 is able to sense each of the memory cells MC to obtain a plurality of sensing results, so that the processing unit 108 is able to obtain an output data stored in the storing unit by looking up a one-time sensing table according to the sensing results.

Figure 4A:
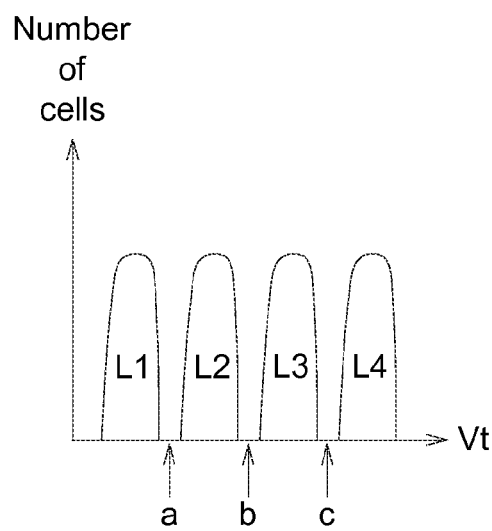
FIG. 4A illustrates an example of the threshold voltage distributions for the first memory unit.

FIG. 4A illustrates an example of the threshold voltage distributions for the first memory unit 102. As shown in FIG. 4A, the first memory unit 102 has four threshold voltage (Vt) regions L1-L4. Sensing voltages "a", "b" or "c" is applied to the word line (e.g., WL(1)) coupled to the first memory unit 102 for read operation. As shown in FIG. 4A, the sensing voltage "a" is between the threshold voltage regions L1 and L2; the sensing voltage "b" is between the threshold voltage regions L2 and L3; and the sensing voltage "c" is between the threshold voltage regions L3 and L4.

Figure 4B:
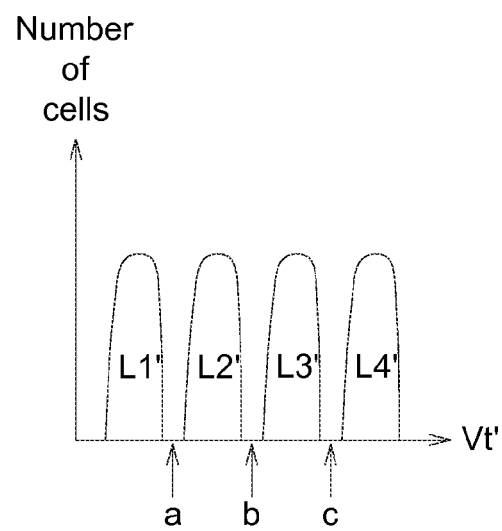
FIG. 4B illustrates an example of the threshold voltage distributions for the second memory unit.

FIG. 4B illustrates an example of the threshold voltage distributions for the second memory unit 104. Similar to the first memory unit 102, the second memory unit 104 has four threshold voltage (Vt') regions L1'-L4'. The sensing voltages "a", "b" or "c" is applied to a word line (e.g., WL(2)) coupled to the second memory unit 104 for the read operation of the storing unit 110.

In the example, both of the first and second memory units 102, 104 have four threshold voltage regions. However, the present invention is not limited to the above example. In other examples, the first and second memory units 102, 104 can have different number of threshold voltage regions.

Figures 5, 6A, 6B:
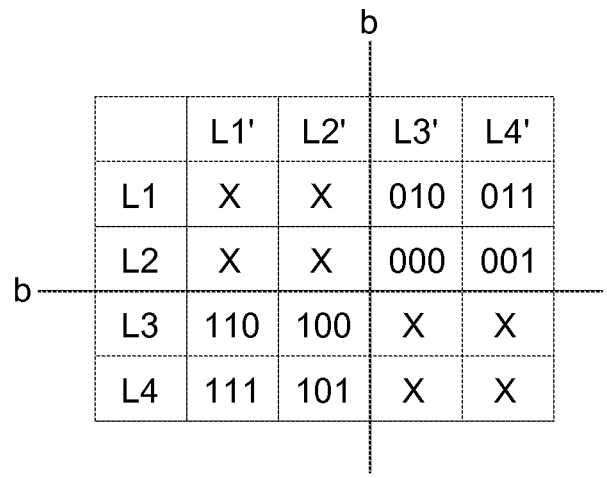
FIG. 5 illustrates a one-time sensing table according to an embodiment of the invention.
FIG. 6A illustrates using the sensing voltage "b" to sense the first bit of 3-bit data based on the one-time sensing table.
FIG. 6B illustrates the relationship between the output data and the sensing results.

FIG. 5 illustrates a one-time sensing table 500 according to an embodiment of the invention. The one-time sensing table 500 stores a plurality of mapping values. The processing unit 108 is able to select one of the mapping values stored in the one-time sensing table 500 as the output data according to the sensing results obtained by the sensing circuit 106.

In the one-time sensing table 500, each of the mapping values represents 3-bit data, and the symbol "X" represents invalid data which will not be taken as the output data. For example, the mapping value corresponding to threshold voltage regions L1 and L3' represents 3-bit data "010," while the symbol "X" corresponding to threshold voltage regions L2 and L2' represents invalid data.

In general, given that the first memory unit 102 stores m bit data and the second memory unit 104 stores n bit data, each of the mapping values stored in the one-time sensing table 500 is represented as k bit data, where m, n and k are integers, and k is less than m+n. For example, given that both of the first and second memory units 102, 104 are MLC cells capable of storing 2 bit data, each of the mapping values stored in the one-time sensing table 500 is represented as 3 bit data. In another example, given that the first memory units 102 is a TLC cell capable of storing 3 bit data and the second memory unit 104 is a MLC cell capable of storing 2 bit data, each of the mapping values stored in the one-time sensing table 500 may be represented as 4 bit data.

Besides, given that the first memory unit 102 has i threshold voltage regions and the second memory unit 104 has j threshold voltage regions, the number of the mapping values stored in the one-time sensing table 500 is z, where i, j and z are integers, and z is less than i×j. For example, given that both of the first and second memory units 102, 104 have 4 threshold voltage regions, the number of the mapping values stored in the one-time sensing table 500 is 8, which is less than 16 (=4×4).

In the embodiment, the sensing voltage "b" is used to sense the first bit (the most significant bit) of a 3-bit data. The sensing voltage "a" is used to sense the second bit of the 3-bit data. And, the sensing voltage "c" is used to sense the third bit (the least significant bit) of the 3-bit data. For better illustrations, descriptions are given with reference to FIGS. 6A, 6B, 7A, 7B, 8A, and 8B below.

FIG. 6A illustrates using the sensing voltage "b" to sense the first bit of 3-bit data based on the one-time sensing table 500. FIG. 6B illustrates the relationship between the output data and the sensing results. As can be seen from FIGS. 6A and 6B, if the threshold voltage (Vt) of the first memory unit 102 is smaller than the sensing voltage "b" (Vt<b), and the threshold voltage (Vt') of the second memory unit 104 is larger than the sensing voltage "b" (Vt'>b), all the first bits of data represented by the mapping values are logical "0". In such case, the processing unit 108 reads output data "0". And, if the threshold voltage (Vt) of the first memory unit 102 is larger than the sensing voltage "b" (Vt>b), and the threshold voltage (Vt') of the second memory unit 104 is smaller than the sensing voltage "b" (Vt'<b), all the first bits of data represented by the mapping values are logical "1". In such case, the processing unit 108 reads output data "1". Therefore, by using the sensing voltage "b" to sense the first and second units 102, 104 only one time, the first bit of data stored in the storing unit 110 can then be read.

FIG. 7A illustrates using the sensing voltage "a" to sense the second bit of 3-bit data based on the one-time sensing table 500. FIG. 7B illustrates the relationship between the output data and the sensing results. As can be seen from FIGS. 7A and 7B, if the threshold voltage (Vt) of the first memory unit 102 is smaller than the sensing voltage "a" (Vt<a), and the threshold voltage (Vt') of the second memory unit 104 is larger than the sensing voltage "a" (Vt'>a), all the second bits of data represented by the mapping values are logical "1". In such case, the processing unit 108 reads output data "1". If the threshold voltage (Vt) of the first memory unit 102 is larger than the sensing voltage "a" (Vt>a), and the threshold voltage (Vt') of the second memory unit 104 is smaller than the sensing voltage "a" (Vt'<a), all the second bits of data represented by the mapping values are also logical "1". In such case, the processing unit 108 reads output data "1". And, if the threshold voltage (Vt) of the first memory unit 102 is larger than the sensing voltage "a" (Vt>a), and the threshold voltage (Vt') of the second memory unit 104 is larger than the sensing voltage "a" (Vt'>a), all the second bits of data represented by the mapping values are logical "0". In such case, the processing unit 108 reads output data "0". Therefore, by using the sensing voltage "a" to sense the first and second units 102, 104 only one time, the second bit of data stored in the storing unit 110 can then be read.

FIG. 8A illustrates using the sensing voltage "c" to sense the third bit of 3-bit data based on the one-time sensing table 500. FIG. 8B illustrates the relationship between the output data and the sensing results. As can be seen from FIGS. 8A and 8B, if the threshold voltage (Vt) of the first memory unit 102 is smaller than the sensing voltage "c" (Vt<c), and the threshold voltage (Vt') of the second memory unit 104 is larger than the sensing voltage "c" (Vt'>c), all the third bits of data represented by the mapping values are logical "1". In such case, the processing unit 108 reads output data "1". If the threshold voltage (Vt) of the first memory unit 102 is larger than the sensing voltage "c" (Vt>c), and the threshold voltage (Vt') of the second memory unit 104 is smaller than the sensing voltage "c" (Vt'<c), all the third bits of data represented by the mapping values are also logical "1". In such case, the processing unit 108 reads output data "1". And, if the threshold voltage (Vt) of the first memory unit 102 is smaller than the sensing voltage "c" (Vt<c), and the threshold voltage (Vt') of the second memory unit 104 is smaller than the sensing voltage "c" (Vt'<c), all the third bits of data represented by the mapping values are logical "0". In such case, the processing unit 108 reads output data "0". Therefore, by using the sensing voltage "c" to sense the first and second units 102, 104 only one time, the third bit of data stored in the storing unit 110 can then be read.

As shown in the above, the memory device according to the embodiments of the invention is able to read one or more bits of data by sensing the memory units of the storing unit only one time and looking up the one-time sensing table according to the sensing results. Therefore, the number of sensing operations for reading memory data can be significantly reduced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory sensing method, comprising:
   providing a storing unit to store data, the storing unit comprising a first memory unit and a second memory unit;
   sensing the first memory unit with a sensing voltage to obtain a first sensing result;
   sensing the second memory unit with the sensing voltage to obtain a second sensing result; and
   looking up a sensing table storing a plurality of mapping values according to the first and second sensing results to determine a first bit of the data of the storing unit;
   wherein when the first sensing result indicates that the sensing voltage is larger than a first threshold voltage of the first memory unit and the second sensing result indicates that the sensing voltage is less than a second threshold voltage of the second memory unit, the first bit is corresponding to a first bit value; and
   when the first sensing result indicates that the sensing voltage is less than the first threshold voltage of the first memory unit and the second sensing result indicates that the sensing voltage is larger than the second threshold voltage of the second memory unit, the first bit is corresponding to a second bit value;
   wherein the first memory unit has i threshold voltage regions and the second memory unit has j threshold voltage regions, and the number of the mapping values stored in the sensing table is z, where i, j and z are integers, and z is less than j×j.

2. The memory sensing method according to claim 1, further comprising:

sensing a third memory unit to obtain a third sensing result; and looking up the sensing table according to the first, second and third sensing results to obtain the data.

3. The memory sensing method according to claim 1, wherein the first memory unit is programmed to the first threshold voltage and is coupled to a first word line, the step of sensing the first memory unit comprises:

applying the sensing voltage to the first word line; and determining the first sensing result according to the relative magnitude of the first sensing voltage and the first threshold voltage.

4. The memory sensing method according to claim 3, wherein the second memory unit is programmed to the second threshold voltage and is coupled to a second word line, the second word line is the same as the first word line or different from the first word line, the step of sensing the second memory unit comprises:

applying the sensing voltage to the second word line; and determining the second sensing result according to the relative magnitude of the sensing voltage and the second threshold voltage.

5. The memory sensing method according to claim 1, wherein the first and second memory cells as a whole are sensed at the same time to obtain the first and second sensing results.

6. The memory sensing method according to claim 1, wherein the first and second memory cells are sensed at different time points to obtain the first and second sensing results.

7. The memory sensing method according to claim 1, wherein the first and second memory units are memory cells of NAND flash, NOR flash, Dynamic Random-Access Memories (DRAMs), Resistive Random-Access Memories (ReRAMs), Phase-Change Random Access Memories (PCRAMs), Magnetoresistive Random-Access Memories (MRAMs) or Static Random Access Memories (SRAM) or the combination thereof.

8. A memory device, comprising:

a storing unit for storing data, comprising:

a first memory unit; and a second memory unit;

a sensing circuit, for sensing the first memory unit with a sensing voltage to obtain a first sensing result, and sensing the second memory unit with the sensing voltage to obtain a second sensing result; and a processing unit, for looking up a sensing table storing a plurality of mapping values according to the first and second sensing results to determine a first bit of obtain the data of the storing unit;

wherein when the first sensing result indicates that the sensing voltage is larger than a first threshold voltage of the first memory unit and the second sensing result indicates that the sensing voltage is less than a second threshold voltage of the second memory unit, the first bit is corresponding to a first bit value; and when the first sensing result indicates that the sensing voltage is less than the first threshold voltage of the first memory unit and the second sensing result indicates that the sensing voltage is larger than the second threshold voltage of the second memory unit, the first bit is corresponding to a second bit value;

wherein the first memory unit has i threshold voltage regions and the second memory unit has i threshold voltage regions, and the number of the mapping values stored in the sensing table is z, where i, i and z are integers, and z is less than j×j.

9. The memory device according to claim 8, further comprising:

a third memory unit;

wherein sensing circuit senses the third memory unit to obtain a third sensing result, and the processing unit looks up the sensing table according to the first, second and third sensing results to obtain the data.

10. The memory device according to claim 8, wherein the first memory unit is programmed to the first threshold voltage and is coupled to a first word line;

wherein the sensing circuit applies the sensing voltage to the first word line and determines the first sensing result according to the relative magnitude of the sensing voltage and the first threshold voltage.

11. The memory device according to claim 10, wherein the second memory unit is programmed to the second threshold voltage and is coupled to a second word line, the second word line is the same as the first word line or different from the first word line;

wherein the sensing circuit applies the sensing voltage to the second word line and determines the second sensing result according to the relative magnitude of the sensing voltage and the second threshold voltage.

12. The memory device according to claim 8, wherein the first and second memory cells as a whole are sensed by the sensing circuit at the same time to obtain the first and second sensing results.

13. The memory device according to claim 8, wherein the first and second memory cells are sensed by the sensing circuit at different time points to obtain the first and second sensing results.

14. The memory device according to claim 8, wherein the first and second memory units are memory cells of NAND flash, NOR flash, Dynamic Random-Access Memories (DRAMs), Resistive Random-Access Memories (ReRAMs), Phase-Change Random Access Memories (PCRAMs), Magnetoresistive Random-Access Memories (MRAMs) or Static Random Access Memories (SRAM) or the combination thereof.

* * * * *